United States Patent
Yeh et al.

(10) Patent No.: US 6,197,642 B1
(45) Date of Patent: *Mar. 6, 2001

(54) METHOD FOR MANUFACTURING GATE TERMINAL

(75) Inventors: Wen-Kuan Yeh, Chupei; Heng-Sheng Huang, Taipei, both of (TW)

(73) Assignee: United Microelectronics Corp., Hsin-Chu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/028,521

(22) Filed: Feb. 24, 1998

(30) Foreign Application Priority Data

Oct. 18, 1997 (TW) .................................. 86115363

(51) Int. Cl.⁷ .................................. H01L 21/336
(52) U.S. Cl. .................. 438/270; 438/429; 438/430; 438/424; 438/585; 438/637; 438/639; 438/738
(58) Field of Search .................. 438/270, 637, 438/639, 585, 424, 429, 430, 738

(56) References Cited

U.S. PATENT DOCUMENTS

| | | |
|---|---|---|
| 5,489,543 * | 2/1996 | Hong . |
| 5,534,447 * | 7/1996 | Hong . |
| 5,538,913 * | 7/1996 | Hong . |
| 5,658,811 * | 8/1997 | Kimura et al. . |
| 5,899,719 * | 5/1999 | Hong . |
| 5,918,132 * | 6/1999 | Qian et al. . |
| 5,960,270 * | 9/1999 | Misra et al. . |
| 6,004,852 * | 12/1999 | Yeh et al. . |
| 6,008,515 * | 12/1999 | Hsia et al. . |
| 6,015,727 * | 1/2000 | Wanlass . |

OTHER PUBLICATIONS

Wolf "Silicon Processing for the VLSI Era–vol. 1," pp. 168–170 and 534, 1986.*

Kimura et al "Short–channel–effect–supressed sub–0.1–micron grooved–gate MOSFET's with W gates," IEEE Trans. Electr. Dev., vol. 42, No. 1 pp. 94–100, Jan. 1995.*

Wong et al "Satpoly: A self–aligned tunsten on polysilicon process for CMOS VLSI applications," IEEE Trans. Elect. Dev., vol. 36, No. 7, pp. 1355–1361, Jul. 1989.*

* cited by examiner

Primary Examiner—Charles Bowers
Assistant Examiner—Jonathan Hack
(74) Attorney, Agent, or Firm—Merchant & Gould PC (57) ABSTRACT

A method for manufacturing a gate terminal comprising the steps of providing a substrate, then forming and patterning an oxide layer to form a gate region. Next, a gate oxide layer and a crystalline silicon layer are formed in the gate region. This is followed by depositing a tungsten layer in the gate region, and then polishing the tungsten layer to form a final tungsten layer functioning as the gate electrode. Finally, the oxide layer is removed. The method of this invention is able to control the dimensions of the gate terminal produced. Moreover, the formation of a thin crystalline silicon layer over the gate oxide layer helps to increase the bonding strength with the metallic layer, and that the gate electrode can be formed at a lower processing temperature. Therefore, the gate so formed has a higher quality and the processing of the semiconductor is much easier. Furthermore, the silicon nitride layer can serve as an etching stop layer during the etching operation of the oxide layer. Consequently, over-exposing the upper trench corner locations of a shallow trench isolation structure can be prevented, thereby avoiding current leakage problems.

18 Claims, 6 Drawing Sheets

METHOD FOR MANUFACTURING GATE TERMINAL

CROSS-REFERENCE TO RELATED APPLICATION

This application claims the priority benefit of Taiwan application serial no. 86115363, filed Oct. 18, 1997, the full disclosure of which is incorporated herein by reference.

BACKGROUND OF THE INVENTION

1. Field of Invention

The present invention relates to a method for manufacturing of a semiconductor device. More particularly, the present invention relates to the method for manufacturing a gate terminal.

2. Description of Related Art

Metallic gate terminals are now extensively used in the fabrication of the gate of a metal oxide semiconductor (MOS) device. This is because the metallic gate terminal has a low resistance; moreover, no extra impurities implantation is necessary for increasing its electrical conductivity. Tungsten is one of the most commonly used materials for forming the gate terminal.

Generally, the metallic tungsten layer is deposited using plasma or laser-enhanced chemical vapor deposition method, or a physical sputtering method. However, during the process of depositing tungsten using plasma or laser-enhanced chemical vapor deposition method, the settling location of the metallic atoms being bombarded by the plasma or laser is difficult to control.

Furthermore, there will be some other impurities having enough energy to settle onto the gate terminal, thereby leading to a poor gate oxide layer and increasing the resistance of the gate terminal. Using a low pressure chemical vapor deposition method is able somehow to prevent the defects of poor gate oxide quality and increased resistance in plasma or laser-enhanced chemical vapor deposition method. However, a rather high temperature of greater than 350° C. are often necessary to deposit tungsten layer over the gate oxide layer. Hence, processing difficulties are increased.

Figure 1A:
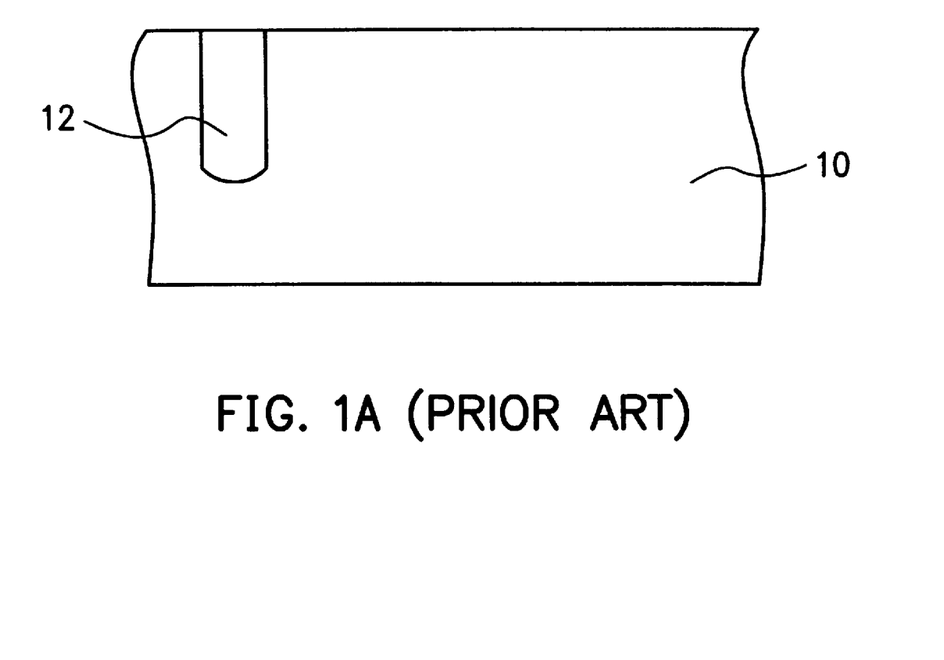
FIGS. 1A through 1D are cross-sectional views showing the progression of manufacturing steps in the fabrication of a conventional gate terminal.

FIGS. 1A through 1D are cross-sectional views showing the progression of manufacturing steps in the fabrication of a conventional gate terminal. First, as shown in FIG. 1A, a substrate 10 is provided. Then, a shallow trench isolation structure 12 and a well (not shown) are formed in the substrate 10.

Figure 1B:
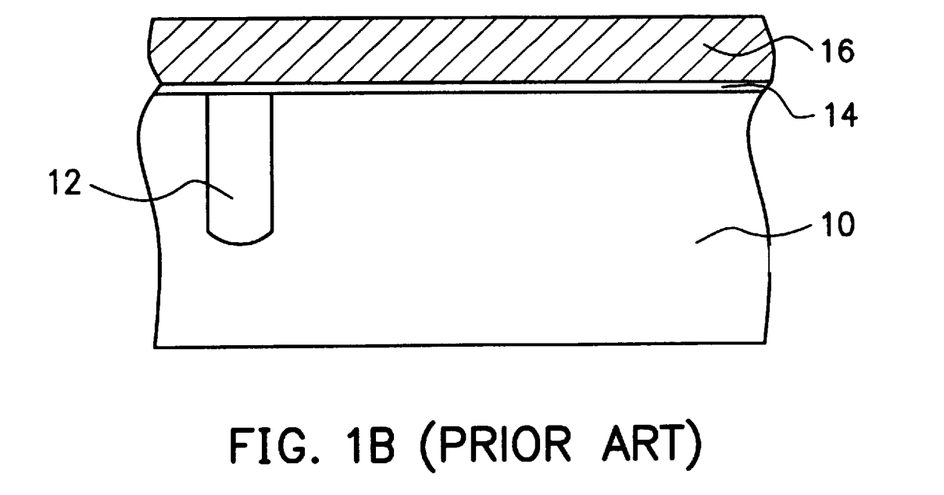
Figure 1C:
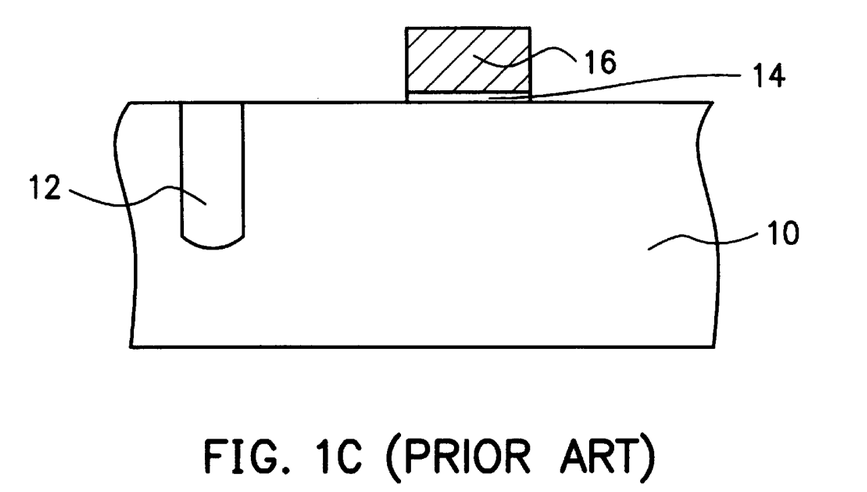

Next, as shown in FIG. 1B, a gate oxide layer 14 is formed over the substrate 10, for example, using a thermal oxidation method. Subsequently, a sputtering method is used to form a tungsten layer 16 over the gate oxide layer 14. Then, the tungsten layer 16 and the gate oxide layer 14 are patterned to form a gate terminal. The tungsten layer 16 can be patterned, for example, by first coating a photoresist layer (not shown) over the tungsten layer 16 while exposing specific portions of the tungsten layer 16. Next, a reactive ion etching (RIE) method is used to remove the exposed tungsten layer 16, and then the gate oxide layer 14 is further etched until the substrate 10 is reached. Later, the photoresist layer is removed.

Figure 1D:
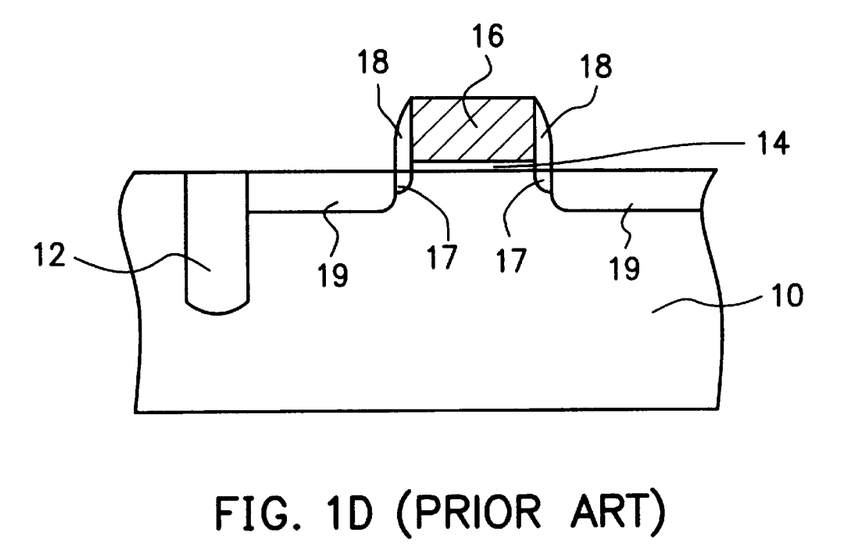

Next, as shown in FIG. 1D, subsequent processes are carried out. Ions of low concentration level are then implanted into the substrate on each side of the gate forming lightly doped source/drain regions 17. Thereafter, an oxide layer is formed over the gate and the substrate 10, for example, using a low pressure chemical vapor deposition method. Next, the oxide layer is anisotropically etched back to form spacers 18 on the sidewalls of the gate using a plasma etching-back method. Using the spacers 18 as masks, highly concentrated ions are then implanted into the substrate on the side of each spacer to form heavily doped source/drain regions 19.

Since a rather high temperature of greater than 350° C. is necessary to deposit a tungsten layer over the gate oxide layer in order to form an electrode, semiconductor processing difficulties are increased.

Furthermore, since the etching process used in a conventional method of patterning the tungsten layer 16 to form a gate electrode is not easy to control, the correct gate dimensions are difficult to get.

In light of the foregoing, there is a need in the art for an improved method for forming a gate terminal.

SUMMARY OF THE INVENTION

Accordingly, the present invention is directed to provide a method for manufacturing a gate terminal that is capable of eliminating the need for a high temperature deposition of tungsten over the gate oxide layer, and the difficulties in getting the correct gate dimensions in patterning the tungsten layer.

To achieve these and other advantages and in accordance with the purpose of the invention, as embodied and broadly described herein, the invention provides a method for manufacturing a gate terminal. The method comprises the steps of providing a substrate having an isolation structure and a well already formed thereon. An oxide layer is then formed over the substrate followed by patterning the oxide layer to form an opening serving as a gate region. Thereafter, a gate oxide layer is formed over the gate region, and then a crystalline silicon layer is formed over the gate oxide layer and over the sidewalls of the oxide layer. Subsequently, a chemical vapor deposition method, for example, using silane to reduce tungsten fluoride ($WF_6$), is employed to deposit a layer of tungsten over the gate region. Next, a chemical-mechanical polishing method is used to polish the tungsten layer to a level almost the same as the oxide layer and forming a tungsten gate electrode. Finally, the oxide layer is removed.

After the removal of the oxide layer, further includes the steps of forming a lightly doped source/drain region in the substrate on each side of the tungsten layer. Then, spacers are formed on each sidewall of the metallic layer. Finally, a heavily doped source/drain region is formed in the substrate on each side of the spacers.

One aspect of this invention is the patterning of a gate region before the deposition of tungsten to form a gate terminal. This enables a proper control over the gate dimensions.

In another aspect, this invention overcomes the difficulties in controlling the etching operation in a conventional method of gate manufacture.

In yet another aspect, the formation of a thin crystalline silicon layer over the gate oxide layer in this invention is able to increase the bonding strength with a metallic layer. This thin crystalline Si can be consumpted during WCVD. Furthermore, a lower temperature can be used to form the gate terminal. Hence, a high quality gate terminal can be formed in addition to the ease of processing.

In a fourth aspect, the use of a silicon nitride layer as an etching stop layer for etching the oxide layer can prevent the over-exposure of the upper corner locations in shallow trench isolation. Thus, kink effect that may cause sub-threshold current and current leakage problems can be prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2A:
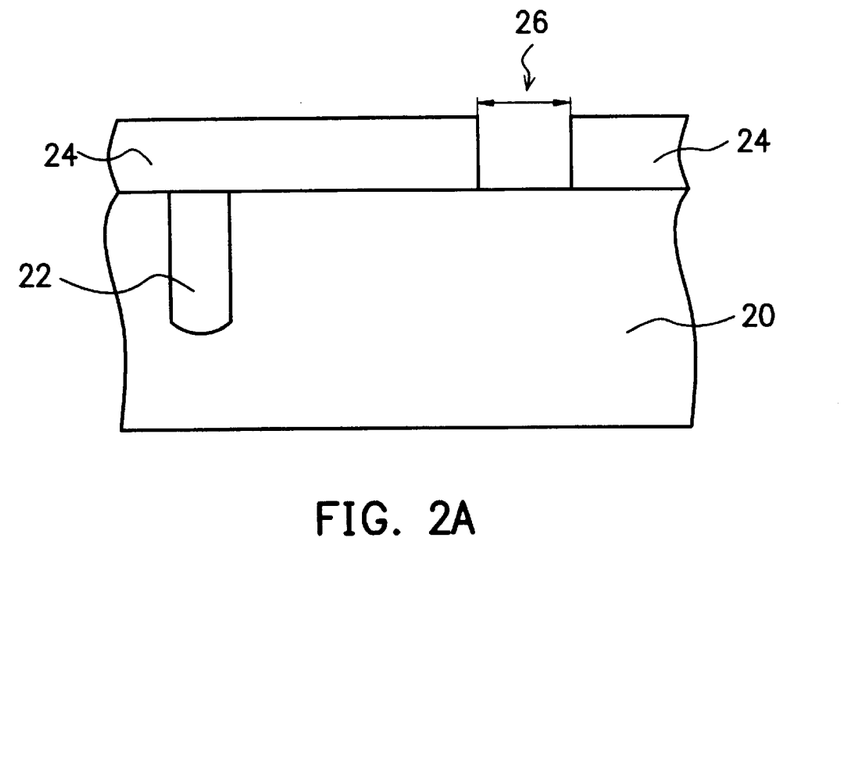
FIGS. 2A through 2E are cross-sectional views showing the progression of manufacturing steps in the fabrication of a gate terminal according to a first preferred embodiment of this invention.

FIGS. 2A through 2E are cross-sectional views showing the progression of manufacturing steps in the fabrication of a gate terminal according to a first preferred embodiment of this invention. First, as shown in FIG. 2A, a substrate 20 is provided. Then, a shallow trench isolation structure 22 and a well (not shown) are formed in the substrate 20. Next, an oxide layer 24 such as a silicon oxide layer is formed over the substrate 20, for example, using a chemical vapor deposition method.

Thereafter, the oxide layer 24 is patterned to form an opening exposing a portion of the substrate 20. The opening is a gate region 26 for forming the gate terminal. The oxide layer 24 can be patterned, for example, by first coating a photoresist layer (not shown) over the oxide layer 24 that exposes the oxide layer in the gate region 26. Then, the exposed oxide layer 24 is anisotropically etched until the substrate 20 is reached using a plasma etching method, followed by the removal of the photoresist layer.

Figure 2B:
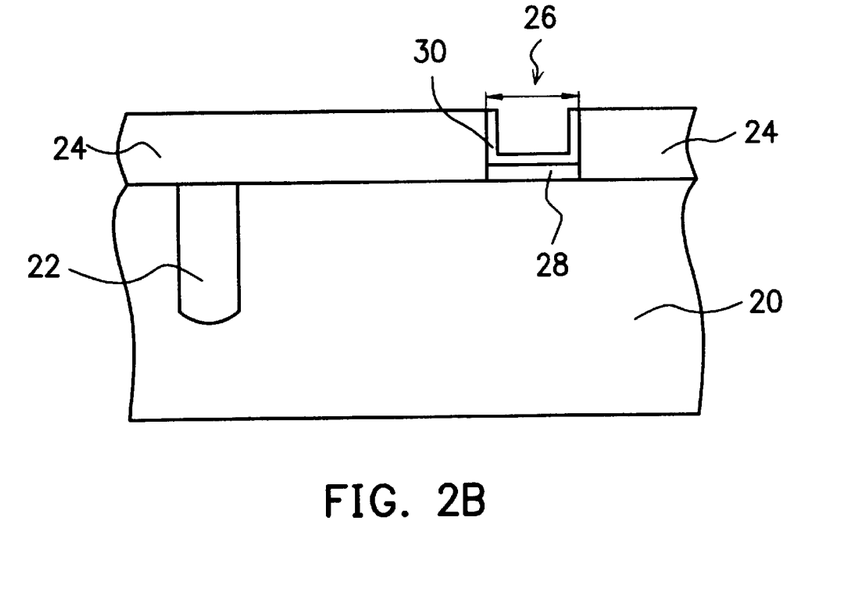

Next, as shown in FIG. 2B, the substrate 20 is placed inside an oxidation furnace to form a gate oxide layer 28 over the exposed substrate in the gate region 26. Thereafter, a thin crystalline silicon layer 30, for example, mono-crystalline silicon, polysilicon or epitaxial silicon, is formed on the sidewalls of the oxide layer 24 and over the exposed gate oxide layer 28 in the gate region 26. The thin crystalline layer 30 is formed, for example, using a low pressure vapor deposition method, and preferably has a thickness of about 200 Å to 300 Å.

Through the formation of this thin crystalline layer 30 over the gate oxide layer 28, bonding strength with subsequently formed metallic layer can be increased and Si will be consumed during CVD-W deposition. Moreover, the metallic layer can be formed at a much lower temperature and a much better quality is produced, thus facilitating the processing of semiconductors. Related techniques that are relevant to the description here can be found in ROC Patent No. 85114147.

Figure 2C:
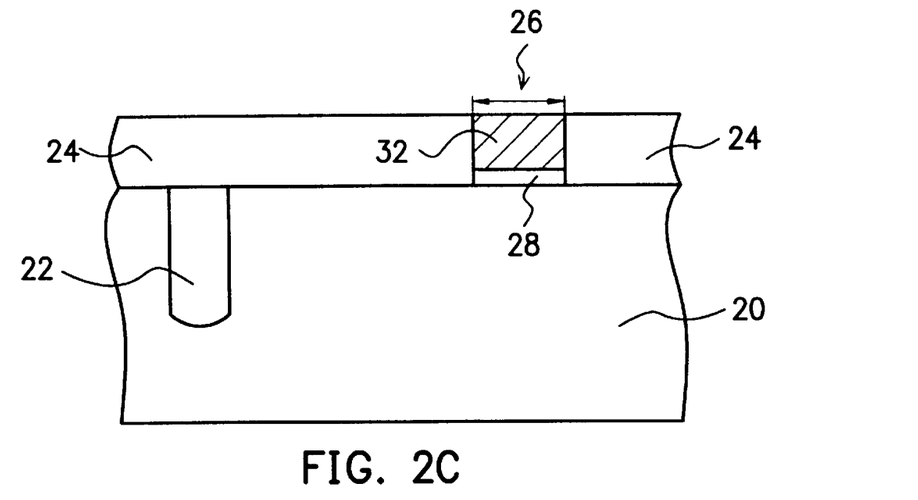

Next, as shown in FIG. 2C, a layer of metal, for example, a tungsten layer is deposited into the gate region 26 using a chemical vapor deposition method. The chemical vapor deposition can be conducted, for example, at about 300° C. By reducing tungsten fluoride using silane, tungsten is deposited into the gate region 26. Furthermore, the crystalline layer 30 will be worn away during the metal deposition process. Next, the top portion of the metallic layer will be polished to the same level as the oxide layer 24, for example, using a chemical-mechanical polishing method. The final metallic layer 32 that is formed over the gate regions 26 after polishing becomes the gate electrode of a MOS transistor.

Figure 2D:
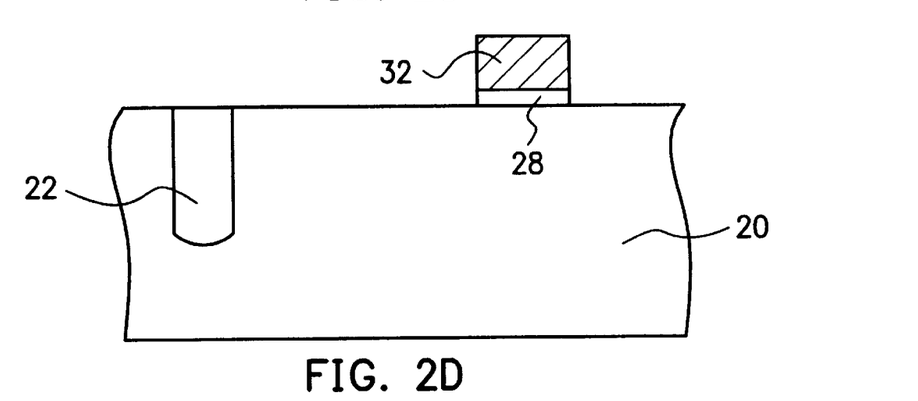

Next, as shown in FIG. 2D, the oxide layer 24 is removed to expose the substrate 20, for example, using an anisotropic dry etching method.

Figure 2E:
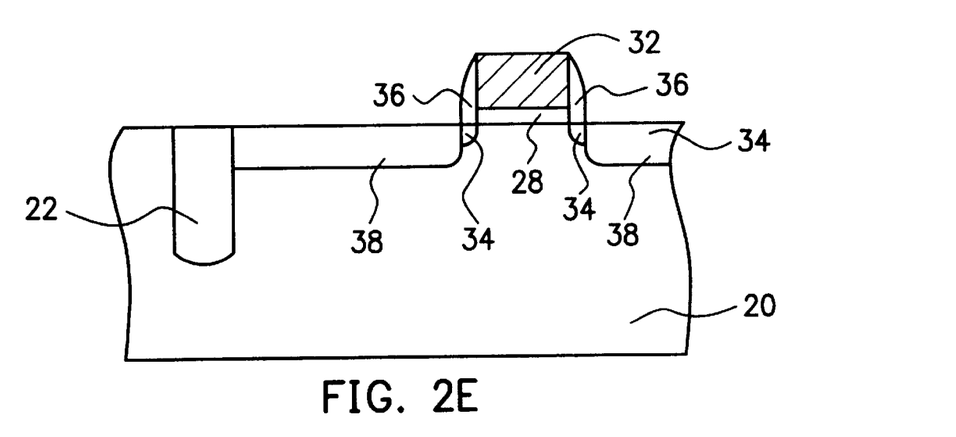

Finally, as shown in FIG. 2E, subsequent processing operations are performed. Ions of low concentration level are then implanted into the substrate 20 on two sides of the gate forming lightly doped source/drain regions 34. Thereafter, an oxide layer is formed over the gate and the substrate 20, for example, using a low pressure chemical vapor deposition method. Next, the oxide layer is anisotropically etched back to form spacers 36 on the sidewalls of the gate using a plasma etching-back method. Using the spacers 36 as masks, highly concentrated ions are then implanted into the substrate on the sides of the spacers to form heavily doped source/drain regions 38.

Figure 3A:
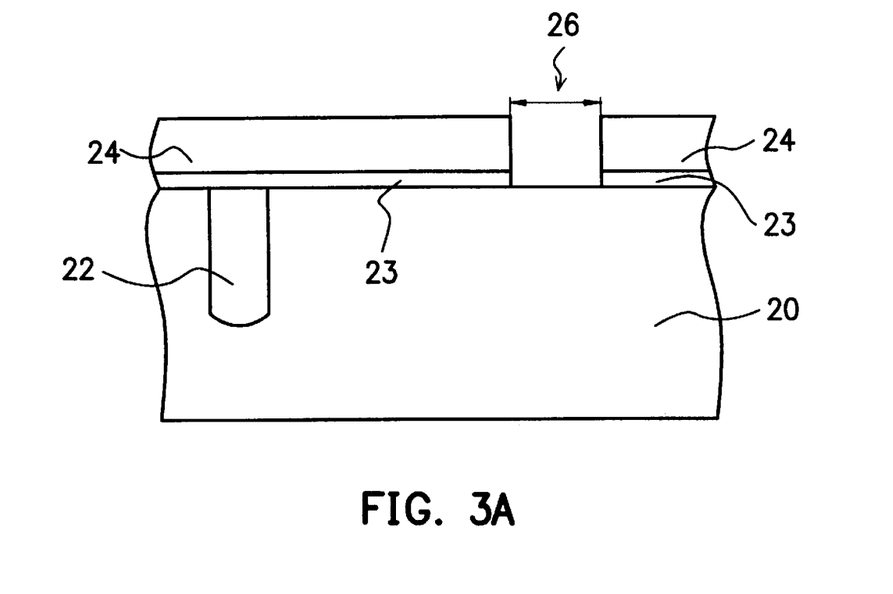
FIGS. 3A through 3E are cross-sectional views showing the progression of manufacturing steps in the fabrication of a gate terminal according to a second preferred embodiment of this invention.

FIGS. 3A through 3E are cross-sectional views showing the progression of manufacturing steps in the fabrication of a gate terminal according to a second preferred embodiment of this invention. First, as shown in FIG. 3A, a substrate 20 is provided. Then, a shallow trench isolation structure 22 and a well (not shown) are formed in the substrate 20. Next, a silicon nitride layer 23 is formed over the substrate 20, for example, using a low pressure vapor deposition method. In the subsequent step, an oxide layer 24 such as a silicon oxide layer is formed over the silicon nitride layer 23, for example, using a chemical vapor deposition method. Thereafter, the oxide layer 24 is patterned to form an opening exposing a portion of the silicon nitride layer 23. The opening is a gate region 26 for forming a gate terminal.

The oxide layer 24 can be patterned, for example, by first coating a photoresist layer (not shown) over the oxide layer 24 and then patterning to expose the oxide layer in the gate region 26. Next, the exposed oxide layer 24 is anisotropically etched until the silicon nitride layer 23 is reached using a plasma etching method. This is followed by the removal of the photoresist layer. After that, using hot phosphoric acid solution, the exposed portion of the silicon nitride layer in the gate region 26 is etched until the substrate 20 is reached.

Compared with the first embodiment, the characteristic of the second embodiment is the addition of one more silicon nitride layer 23 to serve as an etching stop layer for subsequent processes.

Figure 3B:
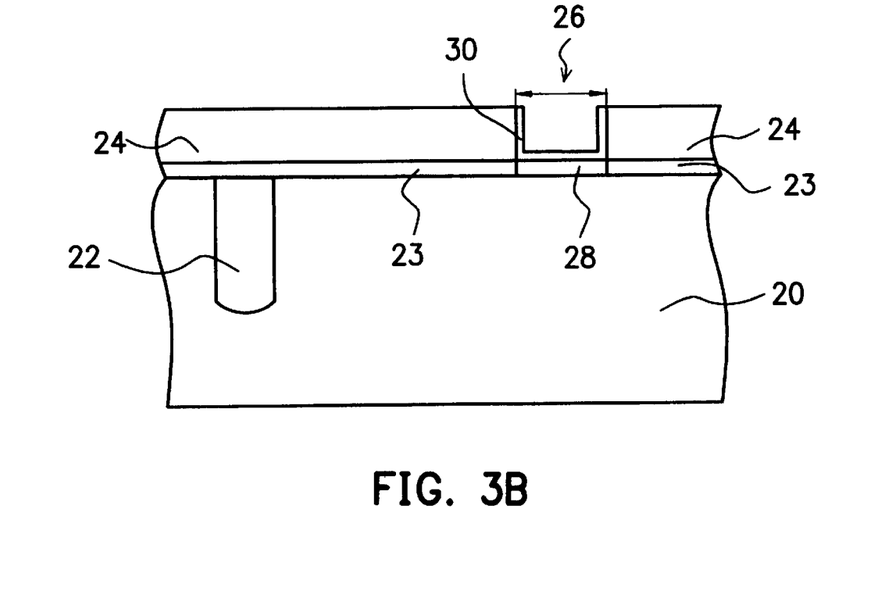

Next, as shown in FIG. 3B, the substrate 20 is placed inside an oxidation furnace to form a gate oxide layer 28 over exposed substrate in the gate region 26. Thereafter, a thin crystalline silicon layer 30, for example, mono-crystalline silicon, polysilicon or epitaxial silicon, is formed on the sidewalls of the oxide layer 24 and over the gate oxide layer 28 in the gate region 26.

The thin crystalline layer 30 is formed, for example, using a low pressure vapor deposition method, and preferably has a thickness of about 200 Å to 300 Å. Through the formation of this thin crystalline layer 30 over the gate oxide layer 28, bonding strength with subsequently formed metallic layer can be increased. This thin Si can be consumed during CVD-W deposition. Moreover, the metallic layer can be formed at a much lower temperature and a much better quality is produced, thus facilitating the processing of semiconductors.

Figure 3C:
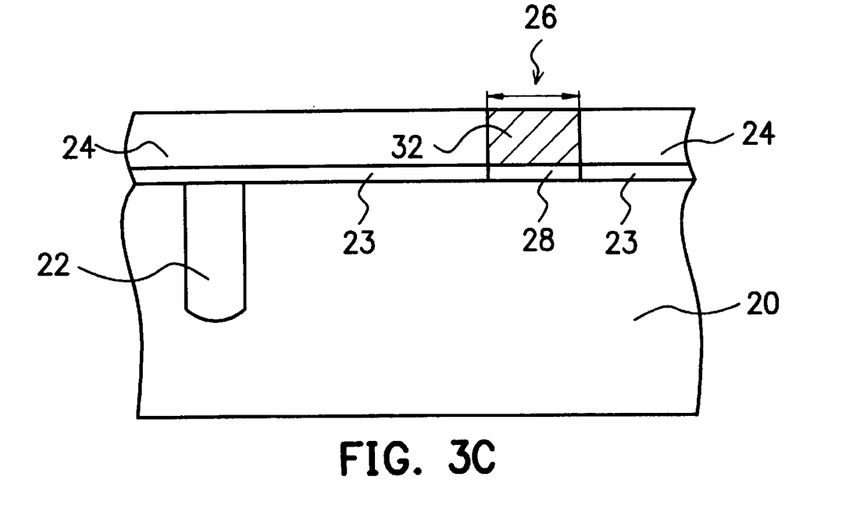

Next, as shown in FIG. 3C, a layer of metal, for example, a tungsten layer is deposited into the gate region 26 using a chemical vapor deposition method. The chemical vapor deposition can be conducted, for example, at about 300° C. By reducing tungsten fluoride using silane, tungsten is deposited into the gate region 26. Furthermore, the crystalline layer 30 will be worn away during the metal deposition process. Next, the top portion of the metallic layer is polished to the same level as the oxide layer 24, for example, using a chemical-mechanical polishing method. The final metallic layer 32 that is formed over the gate regions 26 after polishing becomes the gate terminal of a MOS transistor.

Figure 3D:
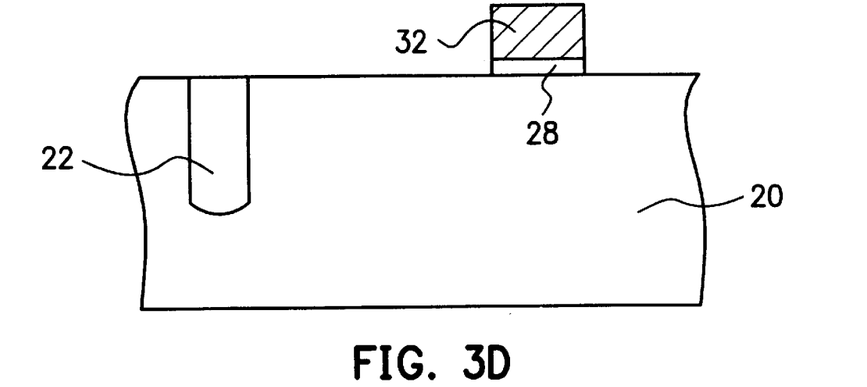

Next, as shown in FIG. 3D, the silicon nitride layer 23 is used as an etching stop layer in the removal of the oxide layer 24 to expose the silicon nitride layer 23. The oxide layer 24 can be removed, for example, using an anisotropic dry etching method. Subsequently, the silicon nitride layer 23 is removed to expose the substrate 20 using a hot phosphoric acid solution.

Figure 3E:
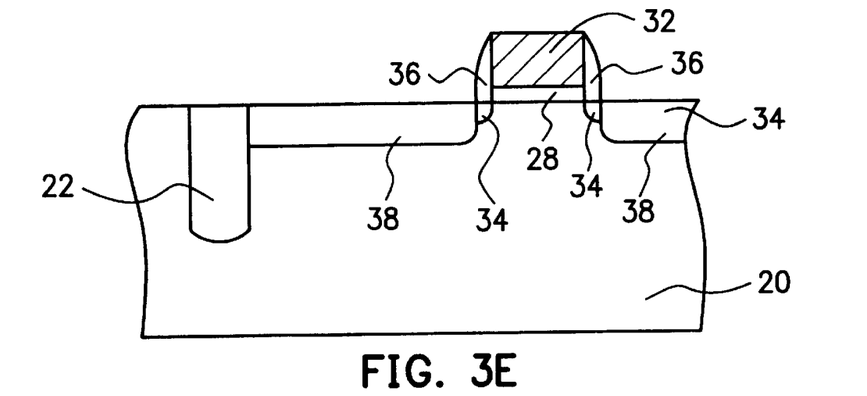

Finally, as shown in FIG. 3E, subsequent processing operations are performed. Ions of low concentration level are then implanted into the substrate 20 on two sides of metal layer 32 forming lightly doped source/drain regions 34. Thereafter, an oxide layer is formed over the metal layer 32 and the substrate 10, for example, using a low pressure chemical vapor deposition method.

Next, the oxide layer is anisotropically etched back to form spacers 36 on the sidewalls of the metal layer 32 using a plasma etching-back method. Using the spacers 36 as masks, highly concentrated ions are then implanted into the substrate 20 on the side of the spacer to form heavily doped source/drain regions 38.

The first characteristic of this invention is that the patterning of the gate region is performed before the deposition of tungsten to form a gate terminal. This enables a proper control over the gate dimensions.

The second characteristic of this invention is the ability to overcome the difficulties in controlling the etching operation in a conventional method of gate manufacture.

The third characteristic of this invention is the formation of a thin crystalline silicon layer over the gate oxide layer. This not only increases the bonding strength of the metallic layer to the gate oxide layer, but also lowers the temperature necessary for the formation of the metal gate. This thin crystalline Si layer can be consumed by $WF_6$ species during CVD-W deposition. Hence, a higher quality gate can be formed while an easier processing method is conducted.

The fourth characteristic of this invention is the use of a silicon nitride layer as an etching stop layer during the etching operation of the oxide layer. Thus, the over-exposure of the upper corner locations of shallow trench isolation can be prevented, thereby avoiding kink effect that may result in sub-threshold current and current leakage problems.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a gate terminal, comprising the steps of:
   providing a substrate having an isolation structure thereon;
   forming a silicon nitride layer on the substrate, at least covering the isolation structure;
   forming an oxide layer over the silicon nitride layer;
   patterning the oxide layer and the silicon nitride layer to form an opening exposing a portion of the substrate, wherein the opening serves a gate region;
   forming a gate oxide layer over the exposed substrate in the gate region;
   forming a crystalline silicon layer having a thickness of 200 Angstroms to 300 Angstroms in the gate region over the sidewalls of the oxide layer and over the exposed gate oxide layer, by using a lower pressure vapor deposition method;
   forming a metallic layer inside the gate region, the crystalline silicon layer being worn away during the metal deposition;
   removing the oxide layer to expose the silicon nitride layer by using the silicon nitride layer as a stop layer;
   removing the silicon nitride layer;
   forming lightly doped source/drain regions in the substrate on each side of the metallic layer via ion implantation;
   forming spacers on two sidewalls of the metallic layer; and
   forming heavily doped source/drain region in the substrate on the sides of the spacers via ion implantation.

2. The method of claim 1, wherein the substrate further includes a well already formed thereon.

3. The method of claim 1, wherein the isolation structure provided is a shallow trench isolation structure.

4. The method of claim 1, wherein the step of forming the spacers includes the substeps of:
   forming a layer of spacer material over the metallic layer and the substrate; and
   etching back the layer of spacer material.

5. The method of claim 1, wherein the step of forming the oxide layer includes using a thermal oxidation method.

6. The method of claim 1, wherein the step of forming the gate region includes the substeps of:
   coating a photoresist layer over the oxide layer and patterning to expose portions of the oxide layer in specified region;
   removing the exposed oxide layer in specified region until the substrate is exposed; and
   removing the photoresist layer.

7. The method of claim 6, wherein the step of removing the exposed oxide layer includes using an anisotropic plasma etching method.

8. The method of claim 1, wherein the step of forming the gate oxide layer includes using a thermal oxidation method.

9. The method of claim 1, wherein the step of forming the crystalline silicon layer includes using a low pressure chemical vapor deposition method.

10. The method of claim 1, wherein the step of forming the crystalline silicon layer includes depositing monocrystalline silicon, or polysilicon, or epitaxially formed silicon.

11. The method of claim 1, wherein the step of forming the metallic layer includes the substeps of:

depositing a layer of metal over the gate region; and polishing the metallic layer until the metallic layer is at the same level as the oxide layer.

12. The method of claim 10, wherein the step of forming the metallic layer includes depositing tungsten.

13. The method of claim 10, wherein the step of forming the metallic layer includes using a chemical vapor deposition method.

14. The method of claim 11, wherein the step of depositing the metallic layer further includes removing the crystalline silicon layer almost completely.

15. The method of claim 10, wherein the step of polishing the metallic layer includes using a chemical-mechanical polishing method.

16. The method of claim 1, wherein the step of forming the gate region further includes the substeps of:

coating a photoresist layer over the oxide layer and patterning to expose a specified portion of the oxide layer;

removing the exposed oxide layer in the specified region exposing the silicon nitride layer;

removing the exposed silicon nitride layer until the substrate is exposed; and removing the photoresist layer.

17. The method of claim 16, wherein the step of removing the exposed oxide layer includes using an anisotropic plasma etching method.

18. The method of claim 16, wherein the step of removing the exposed silicon nitride layer includes using hot phosphoric acid solution.

* * * * *